United States Patent [19]

Behensky et al.

[11] 4,331,698
[45] May 25, 1982

[54] METHOD FOR MAKING A VERY PURE SILICON

[75] Inventors: Gerhard Behensky; Wilhelm Lux, both of Burghausen, Fed. Rep. of Germany

[73] Assignee: Wacker-Chemitronic Gesellschaft für Elektronik-Grundstoffe mbH, Burghausen, Fed. Rep. of Germany

[21] Appl. No.: 166,657

[22] Filed: Jul. 7, 1980

[30] Foreign Application Priority Data

Jul. 13, 1979 [DE] Fed. Rep. of Germany ....... 2928456

[51] Int. Cl.³ .............................................. B05D 5/12
[52] U.S. Cl. ...................................... 427/50; 427/91; 427/95; 427/86; 427/252; 427/51; 118/725
[58] Field of Search ...................... 427/49, 50, 51, 52, 427/95, 91, 93, 94, 86, 252, 250; 118/620, 723, 724, 725; 219/209, 201, 210

[56] References Cited

U.S. PATENT DOCUMENTS

| 2,568,411 | 9/1951 | Reed ..................... 219/486 |
| 3,053,638 | 9/1962 | Reiser ..................... 427/51 |
| 3,232,792 | 2/1966 | Rummel et al. ................ 427/51 |
| 3,242,978 | 3/1966 | McGann ................ 219/486 X |
| 3,941,900 | 3/1976 | Stut et al. ..................... 427/86 |
| 4,215,154 | 7/1980 | Behensky et al. ............ 427/86 X |

FOREIGN PATENT DOCUMENTS 2358053 5/1975 Fed. Rep. of Germany .

Primary Examiner—John D. Smith
Assistant Examiner—Bernard F. Plantz
Attorney, Agent, or Firm—Allison C. Collard; Thomas M. Galgano

[57] ABSTRACT

A process for producing high purity silicon semiconductor materials and metals by the thermal decomposition of a gaseous compound containing the silicon semiconductor material or metal passing over silicon carrier bodies heated by an external electrical power source. The silicon carrier bodies are arranged into groups coupled in parallel electrical connection across the power source during the start of the deposition process. An equal amount of electrical current is passed through each of the groups of the parallel connection to heat the carrier bodies to deposition temperature. The same current flows in each of the parallel carrier groups by using a current-divider inductor having a winding connected to each group.

The groups of carrier bodies are then switched from a parallel electrical connection to a series electrical connection, after the voltage across each heated carrier body reaches a predetermined reduced voltage, so that the current in each carrier body decreases and the current-divider inductor is switched out of the circuit.

3 Claims, 1 Drawing Figure

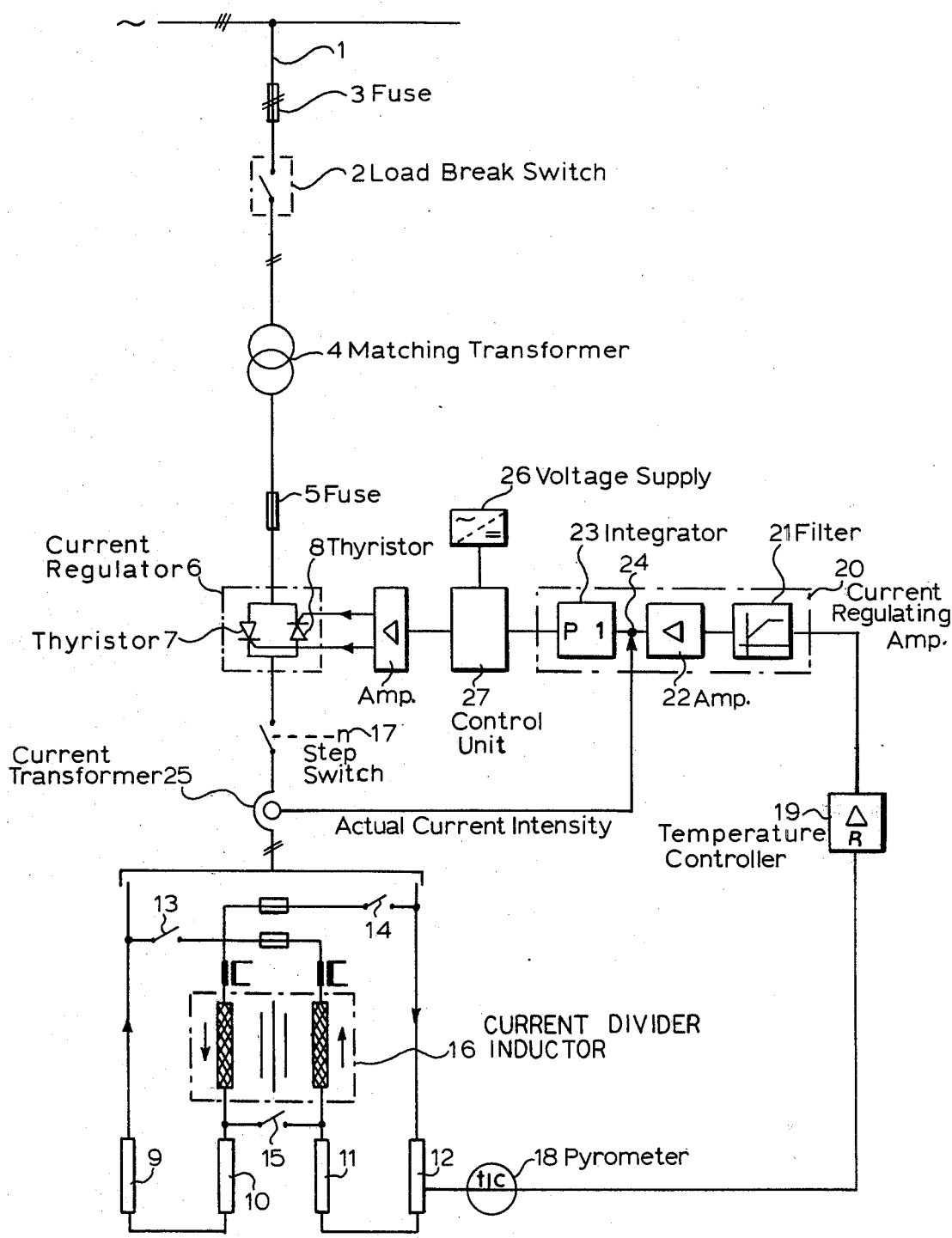

METHOD FOR MAKING A VERY PURE SILICON

The present invention relates to a method for making silicon of high purity by thermal decomposition of its gaseous compounds. More particularly, it relates to such a method wherein groups of carrier elements are electrically heated to the decomposition temperature of the given composition and are connected in parallel at least in the initial stage.

For heating the carrier elements, which generally are thin rods made of very pure silicon, a precisely defined electrical power is required per length of rod. Depending on the rod resistance, which decreases when the temperature of the rod is increased, a defined current or voltage is obtained. Normally, a plurality of carrier elements or rods are used for reasons of economy. These carrier elements must all have the same temperature, because otherwise the rods of higher temperature would grow faster in thickness than the cooler rods. However, the individual rods will only have the same temperature if the current flow therethrough is equal.

In German Laid Open Patent No. 2,358,053, it is mentioned that a parallel connection of the carrier elements is a theoretical possibility. However, in practical application, it was found that due to the negative temperature characteristics of silicon, only a series connection would insure an equal current flow in the carrier elements.

The total length of the carrier elements in the deposition device is limited by the operating voltage for which the equipment is designed. For example, an increase of the number and/or length of the thin silicon rods which function as the carrier elements may be made possible by a higher operating voltage. However, in many countries of the world, an upper limit is placed on the voltage which, in the Federal Republic of Germany, is 1,000 volts. Above this voltage range, considerably more stringent safety rules are applied which, for this reason alone, render the operation of production equipment at such high voltages uneconomical. But even in countries which do not have such stringent safety rules, operation at such increased voltages is not advisable, since it presents a far greater possibility of danger to the operating personnel.

If the operating voltage is not increased, the number and/or length of the carrier elements in a defined decomposition apparatus may only be increased by lowering the resistance of the carrier elements. This is theoretically possible, on the one hand, by using carrier elements having larger diameters. This is disadvantageous, however, because of the considerable expense in preparing these carrier elements. On the other hand, it is possible to lower the resistance of the carrier elements by a corresponding doping with foreign atoms. However, this is not practical in most cases because of purity reasons and, in particular, when making high ohmic material, it is not desirable.

A further possibility of compensating for negative temperature characteristics of a carrier element made of silicon consists of igniting the carrier elements, not by a direct current application but by an external heat source, i.e., to bring it to a temperature at which the resistance of the carrier elements is considerably reduced, so that a current flow at a comparably lower voltage will be sufficient to raise the temperature of the carrier elements to the required decomposition temperature of the gaseous silicon compounds which are being used. However, such a method is extremely expensive and, therefore, not economical.

Finally, in U.S. Pat. No. 3,941,900, a three-phase voltage is used as an auxiliary voltage source and the individual phases of the auxiliary voltage is applied to respective groups of the carrier elements, which are connected in series so that all of the carrier elements have a voltage applied thereto. Immediately after ignition, the actual operation of the deposition apparatus begins with the carrier elements coupled in series, so as to assure that the current flow through all of the rods is equal.

It is therefore an object of the present invention to optimize the efficiency of known deposition devices, without exceeding a defined limit voltage and to increase the number and/or length of the carrier elements used in such deposition apparatus. This object of the invention is obtained by balancing the current flow in the groups of carrier elements arranged in parallel, by an intermediate switching of current-divider inductors in the parallel circuit.

The function of the divider-inductor or current balance device 16 (made as a two-winding transformer) can be described so that each winding of the current divider-inductor is connected in series to one of the two parallel current branches. This transformer is inoperative for equal currents in both windings (stationary state). However, when there is a current change in one of the two windings, it interferes with the ampere-turn balance, so that, in the other windings, a voltage is induced, which, in its associated parallel circuit, causes a parallel compensating effect until the ampere-turn balance is restored.

When 2, 4, 8 or even 16 carrier groups are to be energized, the application of this maximum voltage is carried out to each group having a preferred rod length of one carrier element of about 4.5 m at a voltage limitation of about 1,000 volts. Thus, a small current for each parallel branch is present, corresponding to the resistance of the carrier element group. This current flow causes a temperature increase of the carrier elements, so as to reduce their resistance, and a larger current then flows through the given carrier element, which, in turn, results in a further temperature increase of the carrier element. A temperature control device controls this procedure, so that the actual value of the carrier temperature, measured by a temperature measuring device, is compared with a given nominal value in the temperature control device. Thus, a temperature balance is provided within the reaction chamber of the deposition device. Due to the lowering of the resistance of the several carrier elements as their temperature increases, the current through the elements increases until reaching the predetermined actual value, while, at the same time, the voltage across the elements decreases.

The prerequisite for heating all carrier elements to the same temperature is that the current flow through all carrier element groups be the same current. This is achieved in accordance with the subject invention, by introducing the aforementioned current-divider-inductors in series with the carrier element. Therefore, the expense for maintaining constant control of the current in the individual current branches may be kept at a minimum, in contrast to using expensive control circuits, which are susceptible to interference and, in particular, to breakdowns during the operations, such as when there are rod breaks, etc.

During the deposition process, the diameter of the carrier element increases. In order to maintain a certain deposition temperature (which, generally, is about 1150° to 1250° C., when depositing silicon from hydrogen-trichlorosilane mixtures), the current which flows through the carrier element must be continuously increased. This may be achieved by means of a temperature control, with a subjacent current control. As the diameter of the carrier elements increases, its resistance decreases. This causes a decrease of the voltage with current intensity, since the required load requirement does not increase proportionally with respect to the decrease in resistance.

Since the current flow in all of the carrier element groups in the deposition apparatus is equal, a divergence of the rod temperatures and diameters of the individual carrier element is prevented. One carrier element is used as a lead or reference variable for the temperature control. The equalizing tendency of this arrangement is due to the fact that when a carrier element assumes a larger diameter than that of the lead or reference carrier element, with the amount of current being equal, the temperature of the same and, therefore, the deposition rate decreases per unit of time. If, on the other hand, the carrier element has a diameter which is smaller than the lead carrier element, then a brief increase in both temperature and, in turn, deposition rate per unit of time will result.

In order to obtain an economical utilization of the matching transformer, it is highly desirable, during the lower of the voltage, to switch to about 40% of the initial voltage, by switching the carrier bodies from parallel to a series circuit. Such a switching increases the voltage in accordance with the number of the parallel carrier bodies in each group, while the total current drops by this same factor.

Other objects and features of the present invention will become apparent from the following detailed description, considered in connection with the accompanying drawing, which discloses a single embodiment of the invention. It is to be understood, however, that the drawing is designed for the purpose of illustration only, and not as a definition of the limits of the invention.

In the drawing, a current supply for the carrier element groups installed in a deposition device embodying the present invention, is schematically illustrated.

Referring now in detail to the drawing, power supply 1 (2-phase alternating current) is fed through a circuit breaker switch 2 in series with a fuse 3 and to a voltage-control-matching transformer 4, which reduces the available power supply to the voltage which is required for carrying out the method. From transformer 4, power is fed through a fuse 5 to a current regulator 6. Current regulator 6 is, for example, a current-controlled thyristor having semiconductor rectifier diodes, e.g., thyristors 7 and 8. Fuse 5 acts to protect the thyristors against excessive current. The two carrier element groups which are connected together in the two circuits of the 2-phase alternating current systems, consist of two pairs of rods 9, 10 and 11, 12, which are coupled in parallel at least for the initial ignition. In this case, switches 13 and 14 are closed and switch 15 is opened.

If the installation is designed for an operating voltage having a maximum of 1,000 volts, silicon rods having a length of about 4.5 m and a thickness of 0.5 cm, may be positioned consecutively in the individual current branches. Usually, in practice there are always two carrier rods connected with each other across a conductive current bridge. The current bridge preferably consists of silicon, which is held in water-cooled graphite electrodes in the bottom plate of the deposition apparatus.

After the carrier rods are ignited, i.e., when the voltage is decreased to about 40% of its initial value (i.e., in this case from 1,000 volts to about 400 volts), it is advisable to switch from the parallel to the series circuit using switches 13, 14 and 15, to assure an economical utilization of the matching transformer 4 and the current-divider-inductor 16. To switch to the series circuit, switches 13 and 14 are opened and switch 15 is closed, so that current-divider-inductor 16 is switched out of operation at this point.

Matching transformer 4 is preferably provided with a plurality of secondary windings corresponding to the current and voltage requirements of the power consumption diagram of the deposition process. Due to this adjustment of transformer 4 in combination with the step switch 17 and the switching device (switches 13, 14 and 15), it is possible to make a coarse adjustment of the current and voltage. The current-controlled thyristor-adjuster 6, which is coupled in series with transformer 4, adjusts in a single step the fine control of the current, which is required for maintaining a constant deposition temperature. The actual temperature value which defines this control of the current, is measured optically by means of a temperature measurement device 18, such as, for example, an optical pyrometer. The pyrometer absorbs the radiation heat of one of the carrier elements that passes through a quartz window mounted in the wall of the deposition apparatus. This carrier element in series acts as a reference input for the other carrier elements. The pyrometer measures the absorbed heat and creates a proportional measuring signal, which is fed to temperature control device 19. In the temperature control device 19, the actual temperature value, which had been measured by temperature measurement device 18, is compared with the desired nominal value. The regulated value of the temperature control device 19 produces at its output, a required nominal value for the input to a current-regulating-amplifier 20. This current-regulating-amplifier is a proportional-integral amplifier, and it consists, essentially, of a characteristic curve-forming unit or filter 21, which filters out interference voltages from the input signal; a linear amplifier connected to filter 21; an amplifier 22, which amplifies the input signal; and an electronic integrator circuit 23, which defines the proportional-integral output of the amplifier.

Based on the output signal transmitted from temperature control device 19, the desired nominal value for the current is balanced against the actual current value in the current control amplifier 20. The measured signal of the actual current value at terminal 24 is thus transformed into a measurable value by means of current transformer 25, for example, to a value which, in comparison to the actual current value, is reduced by a factor of $10^{-3}$. The comparison between the actual current value 24, which flows through carrier elements 9–12, and the desired nominal temperature value, produces at the output of the current-regulating amplifier 20, a signal, which is converted into rectangular pulses by means of a control unit 27, which has its own power supply 26. These rectangular pulses are required for controlling the thyristors in the current regulator 6. The output signal from the current control amplifier 22, determines, after the conversion into rectangular pulses, the percentage of modulation of the controllable semiconductor rectifier diodes or thyristors in regulator 6, and, thereby, the temperature by means of the current which flows through the carrier elements. Thus, the deposition temperature of the rods corresponding to the decomposition temperature of the used gaseous compound is obtained slowly by a stepwise increasing of the defined desired or nominal value of the temperature. This stepwise increase of the nominal value, or the stepwise lowering or decrease thereof following deposition, can either be carried out manually or by means of an appropriately-programmed computer.

While only a single embodiment of the present invention has been shown and described, it will be obvious to those skilled in the art, that many changes and modifications may be made thereunto, without departing from the spirit and scope of the invention.

What is claimed is:

1. A process for producing high purity silicon semiconductor materials and metals by thermal decomposition of a gaseous compound containing the silicon semiconductor material or metal passing over silicon carrier bodies heated by an external electrical power source, comprising the steps of:

arranging the silicon carrier bodies into groups coupled in parallel electrical connection across the power source during the start of the deposition process;

passing an equal amount of electrical current through each of the groups of the parallel connection, so as to heat the carrier bodies to deposition temperature;

regulating the current in each of the parallel carrier groups by means of a current-divider inductor having a winding connected to each group, so that the same current flows through each parallel connected group;

passing a gaseous compound containing the silicon material or metal over the heated carrier bodies to permit silicon deposition or metal deposition onto the surface of the carrier bodies; and switching said groups of carrier bodies in parallel electrical connection to a series electrical connection, after the voltage across each carrier body reaches a predetermined reduced voltage after being heated, so that the current in each carrier body decreases and the current-divider inductor is switched out of the circuit.

2. The process according to claim 1, wherein said step of current regulation additionally comprises connecting current controlled thyristors in series with the groups for controlling the current in the several groups.

3. The process as recited in claim 2, comprising a pyrometer optically coupled to one of said carrier bodies and electrically coupled to said thyristors for regulating the current to said groups, so that the carrier bodies will be heated and maintained at the deposition temperature of the gaseous compound.

* * * * *

UNITED STATES PATENT AND TRADEMARK OFFICE
CERTIFICATE OF CORRECTION

PATENT NO. : 4,331,698
DATED : May 25, 1982
INVENTOR(S) : Behensky et al

It is certified that error appears in the above-identified patent and that said Letters Patent is hereby corrected as shown below:

Cover page, (75), line 2, delete "both" and insert -- Josef Waldinger, all --.

Signed and Sealed this

Third Day of August 1982

[SEAL]

Attest:

GERALD J. MOSSINGHOFF

Attesting Officer

Commissioner of Patents and Trademarks